(12) United States Patent
Ito et al.

(10) Patent No.: US 6,717,116 B1
(45) Date of Patent: Apr. 6, 2004

(54) SEMICONDUCTOR PRODUCTION DEVICE CERAMIC PLATE

(75) Inventors: Yasutaka Ito, Ibi-gun (JP); Yasuji Hiramatsu, Ibi-gun (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 09/806,477

(22) PCT Filed: Dec. 28, 1999

(86) PCT No.: PCT/JP99/07368

§ 371 (c)(1),
(2), (4) Date: Jun. 25, 2001

(87) PCT Pub. No.: WO01/13423

PCT Pub. Date: Feb. 22, 2001

(30) Foreign Application Priority Data

Aug. 10, 1999 (JP) .......................... 11-226768

(51) Int. Cl.$^7$ ................................ H05B 3/68
(52) U.S. Cl. .................................... 219/444.1
(58) Field of Search ........... 219/443.1, 444.1, 219/465.1, 466.1, 467.1, 543, 544, 546, 548; 118/424, 425

(56) References Cited

U.S. PATENT DOCUMENTS

| | | | |
|---|---|---|---|
| 5,231,690 A | | 7/1993 | Soma et al. |
| 5,280,156 A | * | 1/1994 | Niori et al. ............... 118/725 |
| 5,463,526 A | * | 10/1995 | Mundt .......................... 361/230 |
| 5,904,872 A | * | 5/1999 | Arami et al. ............. 219/444.1 |
| 6,080,970 A | * | 6/2000 | Yoshida et al. ............. 118/725 |
| 6,133,557 A | * | 10/2000 | Kawanabe et al. ......... 219/544 |
| 6,150,636 A | * | 11/2000 | Bogdanski et al. ...... 219/443.1 |
| 6,344,632 B1 | * | 2/2002 | Yu et al. ..................... 118/725 |

FOREIGN PATENT DOCUMENTS

| | | |
|---|---|---|
| JP | 7-183342 | 7/1995 |
| JP | 7-297265 | 11/1995 |
| JP | 8-66071 | 3/1996 |
| JP | 10-275524 | 10/1998 |
| JP | 10-289944 | 10/1998 |
| JP | 10-338574 | 12/1998 |
| JP | 11-111829 | 4/1999 |

* cited by examiner

*Primary Examiner*—Sang Paik
(74) *Attorney, Agent, or Firm*—Oblon, Spivak, McClelland, Maier & Neustadt, P.C.

(57) ABSTRACT

A ceramic board which, when used as a heater, heats a silicon wafer uniformly throughout and, hence, does not damage the wafer and, when used as an electrostatic chuck, provides a sufficient chucking force. The ceramic board for semiconductor manufacture apparatuses comprising a ceramic substrate and a semiconductor wafer mounted thereon directly or supported indirectly at a fixed distance from its surface, wherein the surface of said ceramic substrate, where said semiconductor wafer is to be mounted or supported, is controlled to a flatness of 1 to 50 $\mu$m over a measurement range of [(diametric end-to-end length) −10 mm].

34 Claims, 6 Drawing Sheets

(a)

(b)

(a)

(b)

SEMICONDUCTOR PRODUCTION DEVICE CERAMIC PLATE

TECHNICAL FIELD

The present invention relates essentially to a ceramic board for the electrostatic chuck, wafer prover and other implements to be used in the manufacture of semiconductor apparatuses and more particularly to a ceramic board for semiconductor manufacture apparatuses which is capable of supporting large-sized semiconductor wafers and dose not adversely affect silicon wafers.

Background Art

Semiconductors are extremely important articles of commerce required in various industries, and typically semiconductor chips are manufactured by the technology which comprises slicing a silicon single crystal to prepare a silicon wafer having a predetermined thickness and constructing various circuits and other components on said wafer.

In the above process for manufacturing a semiconductor chip, various semiconductor production implements each based on a ceramic board, such as the electrostatic chuck, hot plate, wafer prover and susceptor, are used on many occasions.

Regarding such implements for semiconductor manufacture apparatuses, the ceramic boards for use in these applications are described in JP Kokoku 2587289 and Japanese Kokai Publication Hei-10-72260, for instance.

The ceramic boards disclosed in the above patent literature and other publications are invariably available only within the size range of not over about 6 inches (150 mm) in diameter and not less than 8 mm in thickness.

However, the recent trend toward increase in the size of a silicon wafer has led to a demand for ceramic boards as large as 8 inches or more in diameter.

Meanwhile, in the process for manufacturing silicon wafers, heating procedures require the use of a heater having a heating element embedded in a ceramic substrate and for achieving an improved temperature response or follow-up efficiency through a reduction in heat capacity, the thickness of the ceramic board must be reduced to less than 8 mm.

On the other hand, there has been disclosed a ceramic board having a wafer-mounting surface controlled to a roughness value of not more than Rmax=2 $\mu$m (Japanese Kokai Publication Hei-7-280462).

However, the manufacture of a hot plate, an electrostatic chuck or the like using such a large and thin ceramic board was found to involve various problems, for example the creation of a temperature gradient in the silicon wafer placed thereon and consequent destruction of the wafer by thermal shock or the failure to generate a sufficient chucking force despite the reduced surface roughness and the consequent non-uniformity of wafer temperature.

SUMMARY OF THE INVENTION

The inventors of the present invention did much research in the above state of the art and found that troubles such as destruction of the silicon wafer, non-uniformity of wafer temperature due to an insufficient chucking force, and the unevenness of silicon wafer temperature which occurs in a heating mode where the wafer is heated in suspension at a certain distance from the surface of the ceramic board are all caused by the presence of an undulation in the surface of the ceramic substrate. Further investigations revealed that the above troubles can be overcome by reducing the surface undulation of a ceramic substrate so that the surface will fall within a certain range of flatness. The present invention has been developed on the basis of the above finding.

The ceramic board for semiconductor manufacture apparatuses according to a first aspect of the present invention, therefore, comprises a ceramic substrate and semiconductor wafer directly mounted or indirectly supported at a fixed distance from its surface, wherein the surface of a ceramic substrate, where said semiconductor wafer is to be mounted or supported, is controlled to a flatness of 1 $\mu$m to 50 $\mu$m over a measurement range of [(the diametric end-to-end length of the substrate)−10 mm].

The ceramic board for semiconductor manufacture apparatuses according to a second aspect of the present invention comprises a ceramic substrate and a conductor layer disposed internally or on a surface thereof, wherein said surface is controlled to a flatness of 1 to 50 $\mu$m over a measurement range of [(said diametric end-to-end length)−10 mm].

In the ceramic boards for semiconductor manufacture apparatuses according to said first and second aspects of the present invention, said flatness is preferably 1 to 20 $\mu$m.

Flatness is a concept quite different from roughness. Thus, whereas flatness is pertinent to the macroscopic undulation of a surface, roughness is a marker of microscopic irregularities of a surface.

Therefore, if the roughness of a surface is Rmax=20 $\mu$m, it is not necessarily true that the flatness of the surface is 20 $\mu$m. Flatness as so referred to in this specification is defined as the head between the highest point and the lowest point within a measurement range (FIG. 4 and FIG. 5).

Diametric end-to-end length as so referred to in this specification means the length of any imaginary straight line passing through the center of a ceramic substrate from one end to the diametrically opposite end on its periphery. Thus, when the ceramic substrate is circular or disk-shaped, the diametric end-to-end length is the diameter of the disk, and when the ceramic substrate is elliptic in plan view, the diametric end-to-end length means both the dimension of the major axis and that of the minor axis. In the present invention, the measurement range of [(diametric end-to-end length)−10 mm] is established in two directions, i.e. along X- and Y-axes, and whichever larger of the two measured values is taken as the flatness of the ceramic board.

In the present invention, the flatness is measured over the surface area exclusive of the area to be occupied by a silicon wafer, i.e. the marginal area within 5 mm from the periphery of the ceramic substrate. Thus, the [(diametric end-to-end length)−10 mm] is the measurement area.

In the ceramic board for semiconductor manufacture apparatuses, said ceramic substrate is in the form of a disk with a diameter in excess of 150 mm.

The reason is as follows. When the diameter of the disk is not more than 150 mm, the ceramic board and the wafer to be mounted thereon are intrinsically small enough to insure a comparatively uniform temperature distribution. Therefore, the problems to be solved by the invention, namely the risks for breakage of the silicon wafer and non-uniformity of the wafer temperature, do not exist from the beginning.

The ceramic substrate in the present invention is preferably not less than 200 mm in diameter and most preferably not less than 300 mm in diameter, for said risks for breakage of silicon wafers and non-uniformity of the wafer temperature are high when the ceramic substrate is more than 200 mm in diameter.

The ceramic substrate mentioned above preferably comprises nitride ceramics and more preferably comprises aluminum nitride, silicon nitride and/or boron nitride.

Preferably, said ceramic substrate contains more than 50 weight % of aluminum nitride.

The conductor layer disposed internally of the ceramic substrate is preferably formed as at least one layer in the center in thickness direction thereof or in an offset position displaced from said center toward the surface thereof, said surface being opposite to the surface where a semiconductor wafer is to be mounted or supported.

In addition, the conductor layer is preferably formed on the surface of the ceramic substrate, said surface being opposite to the surface where a semiconductor wafer is to be mounted or supported.

The ceramic boards for semiconductor manufacture apparatuses according to the first and second aspects of the present invention preferably comprises a conductor layer formed on the surface of said ceramic substrate and a semiconductor wafer mounted on said conductor layer, said ceramic board functioning as a wafer prover.

Furthermore, the conductor layer disposed internally of said ceramic substrate preferably comprises at least one layer formed in an offset position displaced from the center in thickness direction thereof toward the surface where a semiconductor wafer is to be mounted or supported.

Figure 1:
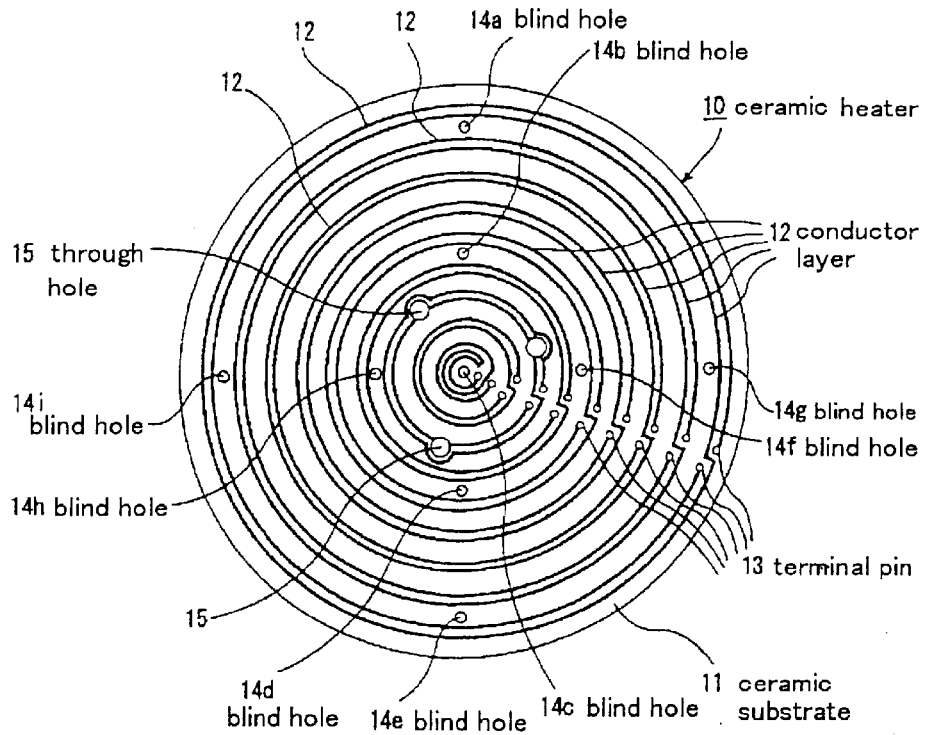
FIG. 1 is a schematic bottom view showing a ceramic heater as an embodiment of the ceramic board for semiconductor manufacture apparatuses according to the present invention.

BRIEF DESCRIPTION OF THE DRAWINGS 3 ceramic substrate
5 guard electrode
6 ground electrode
7 groove
8 air suction hole
10 ceramic heater
11 ceramic substrate
12 conductor layer (heating element)
13 terminal pin
14 (14a to 14i) blind hole
15 through hole
16 support pin
17 metal cover layer
19 silicon wafer
26, 27 plated-through holes
28 recesses
31 support
32 nozzle port for ejecting a cooling medium
33 suction port
34 nozzle port for injecting a cooling medium
41 heating element
101 wafer prover
410 metal cover layer
29, 290, 291 external terminal pins

DETAILED DESCRIPTION OF THE INVENTION

The ceramic board for semiconductor manufacture apparatuses according to the first aspect of the present invention comprises a ceramic substrate having a surface on which a semiconductor wafer is to be directly mounted or indirectly supported at a fixed distance from said surface, in which the degree of flatness of said surface of the ceramic substrate on which a semiconductor wafer is to be directly mounted or indirectly supported (hereinafter referred to sometimes as wafer-mounting surface) is 1 to 50 $\mu$m over a measurement range of [(diametric end-to-end length)−10 mm].

The ceramic board according to the second aspect of the present invention comprises a ceramic substrate and a conductor layer disposed internally or on a surface of said ceramic substrate, in which the degree of flatness of said surface of the ceramic substrate on which a semiconductor wafer is to be directly mounted or indirectly supported is 1 to 50 $\mu$m over a measurement range of [(diametric end-to-end length)−10 mm].

In the ceramic boards for semiconductor manufacture apparatuses according to said first and second aspects of the present invention, the wafer-mounting surface of the ceramic substrate is controlled to a flatness value within a specified range as mentioned above. Therefore, with a hot plate, electrostatic chuck or the like manufactured using either ceramic board as the constituent material, the silicon wafer can be heated uniformly throughout to prevent the breakage of the wafer by thermal shock and, at the same time, can be attracted with a sufficient force of attraction and set securely in position.

Furthermore, in the mode of use where the wafer is supported by means of support pins or the like and heated as such with a clearance of 50 to 500 $\mu$m maintained between the wafer and the ceramic substrate, the span of said clearance can be made substantially uniform so that the uneven distribution of wafer temperature can be prevented.

The ceramic board according to the first aspect of the invention is different from the ceramic board according to the second aspect of the invention only in the restriction on conductor layer and otherwise is identical in construction to the latter ceramic board. Therefore, in the following description of the ceramic boards according to the first and second aspect of the invention, both boards will be collectively referred to as the ceramic board except in cases in which a distinction must be made between the two boards.

The mode of application of the ceramic board of the invention is not restricted to the application in which a silicon wafer is mounted directly or indirectly thereon for various kinds of processing (for example, formation of circuits).

The ceramic board for semiconductor manufacture apparatuses according to the present invention is not restricted to any particular kind insofar as it is used for the manufacture of implements for semiconductor manufacture apparatuses, but includes the electrostatic chuck, wafer prover, susceptor, and hot plate (ceramic heater).

The implements as so referred to in this specification include instruments to be used in the inspection stage.

In the mode of application of the ceramic board for semiconductor manufacture apparatuses according to the invention as a ceramic heater, if the flatness of said wafer-mounting surface exceeds 50 to m over a measurement range of [(diametric end-to-end length)–10 mm], the wafer temperature will not increase sufficiently regardless of whether the wafer is directly mounted or supported at a fixed distance from the wafer-mounting surface.

Thus, even if it is attempted to heat the wafer mounted on such a ceramic board, the wafer will not be heated to a temperature of, say, 200° C. because its contact with the ceramic board is either point contact or line contact. On the other hand, even if it is attempted to heat the wafer supported with pins at a fixed distance from the surface of such a ceramic board, the excessive variation in the clearance between the wafer and the heating surface of the ceramic board will bring the wafer into local contact with the ceramic board, with the result that the wafer cannot be properly heated.

Furthermore, if the flatness value of the wafer-mounting surface of the ceramic board is greater than 20 $\mu$m over a measurement range of [(diametric end-to-end length)–10 mm], a gap will be formed between the silicon wafer and the wafer-mounting surface so that a large temperature gradient is at times produced in the wafer. Moreover, even if it is attempted to heat the wafer supported with support pins or the like at a fixed distance from the ceramic substrate, viz. without contact, the excessively large variation in distance between the silicon wafer and the wafer-mounting surface of the ceramic substrate similarly produces a temperature gradient in the wafer at times.

On the other hand, when said flatness is less than 1 $\mu$m in the mode of use where a silicon wafer is directly mounted on the ceramic board, the wafer comes into intimate contact with the wafer-mounting surface of the ceramic substrate so that the silicon wafer becomes unreleasable due to atmospheric pressure.

When said flatness is greater than 50 $\mu$m in the mode of use of the ceramic board as an electrostatic chuck, attraction of the silicon wafer toward the ceramic substrate causes deformation of the wafer in conformity with the surface undulation of the ceramic board, resulting in cracking of the wafer at times. On the other hand, when said flatness is less than 1 $\mu$m, the silicon wafer comes into intimate contact with the wafer-mounting surface so that the wafer becomes unreleasable due to atmospheric pressure. Although the electrostatic chuck is used in a vacuum, the atmospheric pressure must be reinstated for transfer of the wafer and, then, the trouble of wafer unreleasability occurs.

If said flatness value is greater than 50 $\mu$m in the mode of use of the ceramic board for semiconductor manufacture apparatuses (hereinafter referred to briefly as ceramic board) as a wafer prover, gaps will be created between the silicon wafer mounted and the surface of the ceramic substrate, and when the tester pin is depressed in the area corresponding to such a gap, the silicon wafer deforms in conformity with the surface undulation of the ceramic board and becomes damaged.

On the other hand, setting said flatness value at less than 1 $\mu$m does not make sense economically because there is already a variation of about 1 $\mu$m in the thickness of the chuck top conductor layer itself.

The preferred value of said flatness is 1 to 20 $\mu$m. Thus, when the ceramic board of the present invention is used as a ceramic heater, no remarkable temperature gradient is produced in the silicon wafer. Also, when it is used as an electrostatic chuck, the variation in distance between the silicon wafer and the electrostatic chuck electrodes is small enough so that a sufficient chucking effect is produced and, moreover, the silicon wafer can be easily released from the ceramic substrate after use. When said ceramic board is applied to a wafer prover, the deformation of the silicon wafer is so small that the incidence of wafer damage can be almost completely inhibited.

The wafer prover is an instrument for use in a conduction test which comprises pressing tester pins against a silicon wafer placed thereon.

In the ceramic heater according to the present invention, the shape of said nitride ceramic substrate is not particularly restricted but may for example be elliptic in plan view but a circular board or disk is preferred. When the nitride ceramic board is a disk, its diameter is preferably over 150 mm, more preferably over 200 mm, and still more preferably over 300 mm. This is because the diameters of semiconductor wafers in popular use today are not less than 8 inches (200 mm) and the next-generation semiconductor wafers will mostly be available in the diameter range of not less than 12 inches (300 mm).

Moreover, if the diameter of the ceramic substrate is less than 200 mm, the compatible wafer will also be so small in diameter that it will be readily heated uniformly and even if the flatness value of the ceramic substrate is large, the wafer will be ready to follow the surface topology of the ceramic substrate so that no reduction in chucking force will take place. Thus, such a ceramic substrate does not have the problems to be solved by the present invention.

Thus, the effect of the present invention is particularly remarkable when the ceramic board diameter is not less than 200 mm.

The thickness of said ceramic board is preferably not over 50 mm, for such a board does not easily undergo warp at high temperature. The more preferred thickness is less than 8 mm. This is because, when the board thickness is 8 mm or greater, the heat capacity of the ceramic board is increased so that when the heating and cooling cycle is controlled with a temperature control means, the temperature follow-up efficiency is adversely affected.

The thickness of the ceramic substrate is more preferably not greater than 5 mm. If the thickness exceeds 5 mm, the heat capacity of the substrate will be increased to adversely affect temperature controllability and temperature uniformity of the wafer-mounting surface at times.

For the ceramic board of the present invention, it is preferable to use ceramics having a Young's modulus of not less than 280 GPa over the temperature range of room temperature to 800° C. Such ceramics are not particularly restricted but include nitride ceramics, among others. If Young's modulus is less than 280 GPa, the amount of warp at high temperature will be too large to be controlled even if a reinforcing conductive layer is provided.

The nitride ceramics mentioned above may be any of aluminum nitride, silicon nitride, boron nitride and other ceramics but the use of aluminum nitride is preferred. The most preferred is a ceramic board comprising aluminum nitride of more than 50 weight %. The other ceramic components which can be used include alumina sialon, and the like.

The Young's modulus of said ceramic substrate can be controlled by using a blend or a laminate of two or more different ceramics or incorporating oxides of metals, such as alkali metals, alkaline earth metals, and rare earth metals, carbon, etc. The preferred alkali metals or alkaline earth metals are Li, Na, Ca and Rb, and the preferred rare earth metal is Y. The carbon may be whichever of amorphous carbon and crystalline carbon. The carbon content is preferably 200 to 5000 ppm. By using carbon within this range, the ceramic board can be blackened.

The ceramic board of the present invention preferably has no porosity, i.e. 0%, or a porosity of not over 5%. Thus, when the porosity is controlled to less than 5%, the resulting closed-cell structure insures a high insulation resistance and the board does not warp even at a temperature not less than 200° C., with the surface flatness at room temperature being retained even at high temperature.

The maximum pore diameter of the ceramic substrate is preferably 0 or not more than 50 μm. When the pore size is 0 or not more than 50 μm, the board does not warp even at 200° C. or up and the flatness at room temperature can be maintained at high temperature.

The porosity mentioned above is measured by the method of Archimedes. To measure the maximum pore diameter, 5 samples are prepared and respectively photographed in 10 positions under an electron microscope and the diameters of the largest pores (50 pores) in each shot are averaged.

When a conductor layer is to be formed internally or on a surface of said ceramic substrate, the conductor layer preferably comprises a metal or conductive ceramic paste, and at least a single layer is preferably disposed in the center in thickness direction of the ceramic substrate or in an offset position displaced from the center toward the surface opposite to the wafer-mounting surface. As an alternative, the conductor layer may be formed on the surface opposite to the wafer-mounting surface.

When said conductor layer is to constitute the chuck top electrodes of a wafer prover, the particular conductor layer is formed on the surface of the ceramic substrate on the side on which a semiconductor wafer is mounted. The semiconductor wafer is mounted on this conductor layer.

In addition, the ceramic substrate may be internally formed with a conductor layer functioning as a guard electrode and a ground electrode.

In case the conductor layer is to constitute electrodes (static electrodes) of an electrostatic chuck, it is formed internally of the ceramic substrate but closer to the wafer-mounting surface.

Since warp results in extension of the ceramics in the region farthest from the wafer-mounting surface, this warp is precluded by disposing a conductor layer as a reinforcement in the region of said extension, whereby the silicon wafer can be protected against damage. Then, in the mode of use as a wafer prover, an accurate conduction test can be carried out, while in the case of an electrostatic chuck, the reduction in the force of attraction acting on the silicon wafer can be prevented.

The configuration of said conductor layer may for example be a plane, several divisions of a plane, a vortex, concentric circles, or a grid.

The thickness of said conductor layer is preferably about 1 to 50 μm. If the layer is less than 1 μm thick, no reinforcing effect will be obtained. If the thickness is greater than 50 μm, warp of the whole ceramic board and a reduction in flatness of the wafer-mounting surface will be induced.

The conductor layer may for example be comprised of a sintered metal, non-sintered metal, or a sintered conductive ceramic material.

The raw material of said sintered metal or non-sintered metal may for example be a high-melting metal. The high-melting metal mentioned just above includes tungsten, molybdenum, nickel and indium. These metals may be used singly or in a combination of two or more species.

The conductive ceramic material mentioned above includes the carbide of tungsten or molybdenum.

The conductor layer, when it is formed internally of the ceramic substrate, may be utilized as, for example, a heating element, a guard electrode, a ground electrode and/or static electrodes and, when it is formed on the surface of the ceramic substrate, can be utilized as, for example, a heating element or chuck top electrodes.

Furthermore, as mentioned above, the ceramic substrate may be internally formed with a plurality of conductor layers adapted to function as, for example, a heating element, a guard electrode, a ground electrode, etc., respectively.

The ceramic board provided with a heating element and others in this manner can be used as, for example, a hot plate (ceramic heater), an electrostatic chuck, or a wafer prover.

Figure 2:
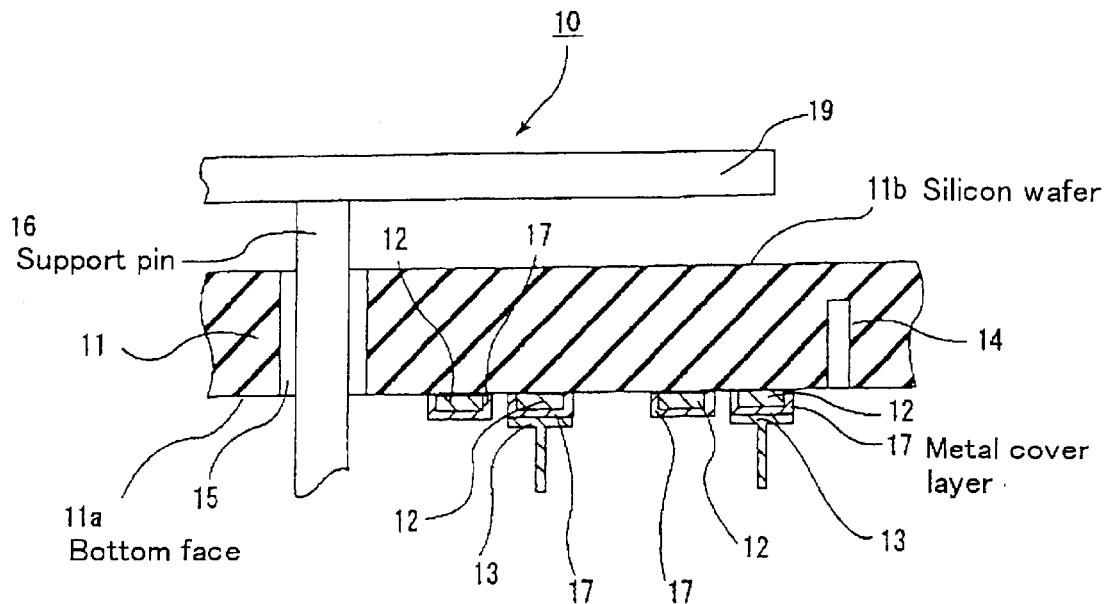
FIG. 2 is a partial section view, on exaggerated scale, of the ceramic board of FIG. 1.

FIG. 1 is a schematic bottom view of a ceramic heater as an application of the ceramic board for semiconductor manufacture apparatuses according to the present invention and FIG. 2 is a schematic partial section view, on exaggerated scale, of the same ceramic heater.

A ceramic substrate 11 is provided in the form of a disk and a conductor layer (heating element) 12 is formed in a pattern of concentric circles on the bottom surface of said ceramic substrate 11 for heating the whole wafer-mounting surface to a uniform temperature.

The conductor layer 12 pattern comprises a plurality of concentric circles with each set of two neighboring circles constituting a single conductor line which is connected, at ends, to an input and an output terminal pin 13. In the area close to the center of the pattern, through holes 15 are formed for accepting support pins 16. In addition, blind holes 14a to 14i are formed for accepting temperature probes.

As shown in FIG. 2, said support pins 16 are adapted to support a silicon wafer 19 and to raise and lower it with respect to the ceramic board surface so that the wafer 19 may be delivered to a transfer machine (not shown) or received from the like transfer machine.

The conductor layer 12 as the heating element may be disposed internally in the center in thickness direction of the ceramic substrate 11 or in an offset position displaced from the center toward the wafer-mounting surface.

In the above ceramic heater, the conductor layer 12 functions not only as a mechanical reinforcement but also as a heating element.

For providing said conductor layer 12 either internally or on the surface of the ceramic substrate, a conductive paste containing a metal or conductive ceramic powder is preferably employed.

Thus, the procedure for constructing a conductor layer internally of the ceramic substrate comprises forming a conductor paste layer on a green sheet, laminating one or more green sheets thereon and baking the laminate. On the other hand, the procedure for constructing a conductor layer on the surface generally comprises fabricating a ceramic substrate, forming a conductor paste layer on the surface of the substrate and sintering it.

The conductor paste mentioned above is not particularly restricted but is preferably a paste containing a resin, a solvent, a thickener, etc. in addition to the metal or conductive ceramic powder necessary for electrical conductivity.

The preferred metal powder for this purpose includes powders of noble metals (gold, silver, platinum, palladium), lead, tungsten, molybdenum and nickel. These may be used alone or in a combination of two or more species. These metals are more or less hardly oxidizable and have sufficient resistance to generate heat.

The conductive ceramic powder includes a powder of tungsten carbide or molybdenum carbide. These powders can be used singly or in a combination of two or more species.

The preferred particle diameter of said metal or conductive ceramic powder is 0.1 to 100 μm. If the powder is finer than 0.1 μm, it will be ready to be oxidized. On the other hand, if the limit of 100 μm is exceeded, the powder will not be easily sintered and the resistance value will be increased.

The metal powder mentioned above may be spherical or flaky. A mixture of spherical and flaky powders may also be employed.

When the metal powder comprises flaky particles or a mixture of spherical and flaky particles, the metal oxide added is held more effectively between the metal particles, with the consequent advantage that a firmer adhesion can be realized between the conductor layer 12 and the nitride ceramics and that the resistance value can be increased.

The resin for use in the conductor paste includes epoxy resin and phenolic resin. The solvent may for example be isopropyl alcohol. The thickener may for example be cellulose.

As mentioned above, the conductor paste is preferably a paste prepared by adding metal oxides to the starting metal powder so that the conductor layer 12 will be a sintered body composed of the metal and metal oxide. Thus, by sintering the metal oxide together with the metal powder, an intimate bond can be realized between the substrate nitride ceramics and the metal powder.

It has not fully been clarified as yet why incorporation of said metal oxide results in an improved adhesion to the nitride ceramics, but it may be suggested that since both the surface of the metal particles and that of the nitride ceramics have been slightly oxidized and the resulting oxide films are integrally sintered together with the intermediary of the metal oxides added, thus causing an intimate adhesion of the metal powder to the nitride ceramics.

The metal oxide mentioned above is preferably at least one member selected from the group consisting of lead oxide, zinc oxide, silica, boron oxide ($B_2O_3$), alumina, yttria and titania.

These oxides are capable of improving the adhesion between the metal powder and nitride ceramics without increasing the resistance value of the conductor layer 12.

The proportions of said lead oxide, zinc oxide, silica, boron oxide ($B_2O_3$), alumina, yttria and titania in each 100 weight parts of the total metal oxide are 1 to 10 (weight parts; the same applies below) for lead oxide, 1 to 30 for silica, 5 to 50 for boron oxide, 20 to 70 for zinc oxide, 1 to 10 for alumina, 1 to 50 for yttria, and 1 to 50 for titania. The total of these oxides is preferably not more than 100 weight parts.

By adjusting the amount of the oxide within the above range, the adhesion to nitride ceramics, in particular, can be improved.

The addition amount of said metal oxide relative to the metal powder is preferably not less than 0.1 weight % and less than 10 weights. Moreover, the area resistivity of a conductor layer 12 formed from a conductor paste of such composition is preferably 1 to 45 mΩ/□.

If the area resistivity exceeds 45 mΩ/□, the generation of heat will be too great in relation to the level of voltage applied so that the amount of heat can hardly be controlled in the case of a ceramic substrate 11 carrying the conductor layer 12 on the surface. If the addition amount of said metal oxide exceeds 10 weight %, the area resistivity will exceed 50 mΩ/□, so that the excessively increased heat generation makes temperature control difficult and the uniformity of temperature distribution will be sacrificed.

When the conductor layer 12 is formed on the surface of the ceramic substrate 11, the surface of the conductor layer 12 is preferably provided with a metal cover layer 17 as illustrated in FIG. 2 for preventing oxidation of the sintered metal and consequent change in resistance value. The thickness of the metal cover layer thus formed is preferably 0.1 to 10 μm.

The metal for use in the formation of said metal cover layer is not particularly restricted only provided that it is a non-oxidizable metal but may for example be gold, silver, palladium, platinum or nickel. These metals can be used alone or in a combination of two or more species. Among the metals mentioned above, nickel is particularly preferred.

Where necessary, in accordance with the present invention, thermocouples may be embedded in the ceramic board. This is because by measuring the temperature of the heating element with the thermocouples and varying the voltage and current values based on the temperature data, the heater temperature can be controlled.

The size of junctions of the conductors of the thermocouple is preferably equal to the diameter of each conductor or larger but not larger than 0.5 mm. By this arrangement, the heat capacity of each thermojunction is kept small so that the temperature is accurately and rapidly transformed to a current value. As a result, the temperature controllability is improved and the temperature distribution of the wafer-heating surface is narrowed.

As examples of said thermocouple, the K, R, B, S, E, J and T thermocouples as defined in JIS C-1602 (1980) can be mentioned.

The process for manufacturing a ceramic board for semiconductor manufacture apparatuses according to the present invention is now described. In the first place, the procedure for fabricating a ceramic board formed with a conductor layer 12 on the bottom side of a ceramic substrate 11, shown in FIG. 1, is described.

(1) Fabrication of a Ceramic Substrate

The nitride ceramic powder described above, e.g. an aluminum nitride ceramic powder, is formulated with optional sintering aids, such as yttria, etc., a binder and other components to prepare a slurry. This slurry is granulated by the spray-drying method and the resulting granules are placed in a metal mold or the like and compressed into a green board.

Then, the green board is optionally formed with through holes 15 for accepting the support pins 16 for supporting a silicon wafer and with blind holes 14a to 14i in which temperature probes such as thermocouples are to be embedded.

Then, this green board is sintered by heating to provide a blank ceramic board. A ceramic substrate 11 is then prepared by machining this ceramic board to predetermined shape. As an alternative, the board may be formed to the specified size so that it may directly serve as a ceramic substrate 11. By conducting a sintering operation under pressure, a pore-free ceramic substrate 11 can be fabricated. The heating temperature may be any temperature not below the sintering point but, in the case of nitride ceramics, the range of 1000 to 2500° C. is used.

The flatness is adjusted after sintering. The desired flatness can be attained by grinding both sides simultaneously using a #100 to #800 (grit size) diamond wheel (two-sided wheel) while a pressure of 0.1 to 50 kg/cm$^2$ is applied.

If the grittiness is too small, the surface undulation of the ceramic substrate cannot be fully ground off. If the grittiness is too great, the very grittiness of the wheel surface rather creates an undulation. The rotational speed of the diamond wheel is 50 to 300 rpm.

The diamond wheel is prepared by electrodeposition of diamond.

When both sides are ground concurrently, the grinding stress tends to cause a slight warp in the ceramic substrate, making it difficult to provide for a flatness of less than 1 $\mu$m. To assure a flatness of less than 1 $\mu$m, only one side is ground under dead load.

(2) Printing the Ceramic Substrate With a Conductor Paste

The conductor paste is generally a highly viscous fluid comprising a metal powder, a resin and a solvent. The conductor paste layer is formed by printing the substrate in the areas corresponding to the conductor layer with said conductor paste by the screen printing technique, for instance. Since the conductor layer is required to heat the ceramic substrate uniformly over its whole surface, it is preferably printed in a concentric circular pattern as illustrated in FIG. 1.

It is preferable that the conductor paste layer be formed in such a manner that the conductor layer 12 after baking will present a rectangular section and a flat surface.

(3) Sintering the Conductor Paste

The conductor paste layer formed on the bottom surface of the ceramic substrate 11 is then heated and sitered to remove the resin and solvent and bake the metal powder onto the bottom surface of the ceramic substrate 11 to complete a conductor layer 12. The heating temperature is preferably 500 to 1000° C.

When said metal oxide has been incorporated in the conductor paste, the metal powder, ceramic substrate and metal oxide are integrally sintered to provide an improved bond between the conductor layer and ceramic substrate.

(4) Formation of a Metal Cover Layer

The surface of the conductor layer 12 is preferably provided with the metal cover layer. The metal cover layer can be formed by, for example, electrolytic plating, electroless plating or sputtering but, for mass production, electroless plating is the most suitable method.

(5) Attaching Terminals etc.

To ends of each circuit pattern of the conductor layer (heating element) 12, terminals (terminal pins 13) for electrical connection to a power source are attached by soldering. In addition, thermocouples are set in the blind holes 14a to 14i and sealed with a ceramic and a heat-resistant resin such as a polyimide resin to complete the manufacture of a ceramic board having a conductor layer on the bottom side.

The method of manufacturing a ceramic board having a conductor layer 12 formed internally of a ceramic substrate is now described.

(1) Fabrication of a Ceramic Substrate

First, the nitride ceramic powder is mixed with the binder, solvent, etc. to prepare a paste, and using the paste, a green sheet is formed.

The ceramic powder which can be used includes an aluminum nitride powder, and where necessary, sintering aids such as yttria may be added.

The binder is preferably at least one member selected from the group consisting of acrylic binder, ethylcellulose, butylcellosolve and polyvinyl alcohol.

The solvent is preferably at least one member selected from the group consisting of α-terpineol and glycol.

The paste obtained by compounding those components is molded by the doctor blade method to provide said green sheet.

The preferred thickness of the green sheet is 0.1 to 5 mm.

Then, where necessary, the green sheet is formed with means to serve as through holes for accepting support pins for supporting a silicon wafer, means to serve as blind holes in which temperature probes such as thermocouples are to be embedded, and means for serving as plated-through holes for connecting the conductor layer to external terminal pins. This processing may be carried out after formation of a green sheet laminate to be described below.

(2) Printing the Green Sheet With the Conductive Paste

On the green sheet, the conductive paste containing a metal or conductive ceramic powder is printed.

The conductive paste contains a metal or conductive ceramic powder.

The mean particle diameter of tungsten or molybdenum powder is preferably 0.1 to 5 $\mu$m. If the mean particle diameter is less than 0.1 $\mu$m or over 5 $\mu$m, the conductive paste will hardly be printed.

The conductive paste may for example be a composition (paste) composed of 85 to 87 weight parts of a metal or conductive ceramic powder, 1.5 to 10 weight parts of at least one kind of binder selected from the group consisting of acrylic binder, ethylcellulose, butylcellosolve and polyvinyl alcohol, and at least one kind of solvent selected from the group consisting of α-terpineol and glycol.

(3) Laminating Green Sheets

The green sheets not printed with the conductive paste are laminated on both sides of the green sheet printed with the conductive paste.

In this step, it is arranged so that the number of green sheets to be laminated on the top side is larger than the number of green sheets to be laminated on the bottom side so that the conductor layer will be situated offset in the direction of the bottom side.

Specifically, the preferred number of green sheets laminated is 20 to 50 on the top side and 5 to 20 on the bottom side.

(4) Sintering the Green Sheet Laminate

The green sheet laminate is hot-pressed to sinter the green sheets and the conductive paste within the laminate.

The heating temperature is preferably 1000 to 2000° C. and the pressure to be applied is preferably 100 to 200 kg/cm$^2$. The heating is performed in an inert gas atmosphere. The inert gas may for example be argon gas or nitrogen gas.

The blind holes for accepting temperature probes may be formed after this sintering operation. The blind holes can be formed by blasting, e.g. sandblasting, after surface grinding. In addition, terminals are connected to the plated-through holes for electrical connection to the internal conductor layer, followed by heating for reflow. The heating temperature is preferably 200 to 500° C.

The flatness is adjusted after sintering. The desired flatness can be attained by grinding both sides simultaneously using a #100 to #800 (grit size) diamond wheel (two-sided wheel) while a pressure of 0.1 to 50 kg/cm$^2$ is applied.

If the grittiness is too small, the surface undulation of the ceramic substrate cannot be fully ground off. If the grittiness is too great, the very grittiness of the wheel surface rather creates an undulation. The rotational speed of the diamond wheel is 50 to 300 rpm.

The diamond wheel is prepared by electrodeposition of diamond.

When both sides are ground concurrently, the grinding stress tends to cause a slight warp in the ceramic substrate, making it difficult to provide for a flatness of less than 1 μm. To assure a flatness of less than 1 μm, only one side is ground under dead load.

Then, the thermocouples as temperature probes are sealed with a heat-resistant resin to complete a ceramic board internally provided with a conductor layer.

BEST MODE FOR CARRYING OUT THE INVENTION

The present invention is now described in further detail.

EXAMPLE 1

Manufacture of a Ceramic Board Internally Provided With a Conductor Layer (1) A paste prepared by compounding 100 weight parts of aluminum nitride powder (manufactured by Tokuyama Co.; average part. dia.: 1.1 μm), 4 weight parts of yttria (average part. dia.: 0.4 μm), 11.5 weight parts of acrylic binder, 0.5 weight part of dispersant and 53 weight parts of alcohol comprising 1-butanol and ethanol was molded by the doctor blade method to prepare a 0.47 mm-thick green sheet.

(2) This green sheet was dried at 80° C. for 5 hours and, then, punched to form openings corresponding to through holes for accepting silicon wafer-supporting pins (1.8 mm, 3.0 mm and 5.0 mm in diameter) and openings corresponding to plate-through holes for connection to terminal pins.

(3) A conductor paste A was prepared by compounding 100 weight parts of a tungsten carbide powder having an average particle diameter of 1 μm, 3.0 weight parts of acrylic binder, 3.5 weight parts of the solvent α-terpineol, and 0.3 weight part of dispersant.

A conductor paste B was also prepared by compounding 100 weight parts of a tungsten powder having an average particle diameter of 3 μm, 1.9 weight parts of acrylic binder, 3.7 weight parts of the solvent α-terpineol, and 0.2 weight part of dispersant.

The above conductive paste A was printed on the green sheet by screen printing to form a conductor paste layer 104. The printing pattern was a concentric circular pattern as shown in FIG. 1. In addition, said through holes corresponding to plated-through holes for connecting terminal pins were filled with said conductor paste B.

Figure 3:
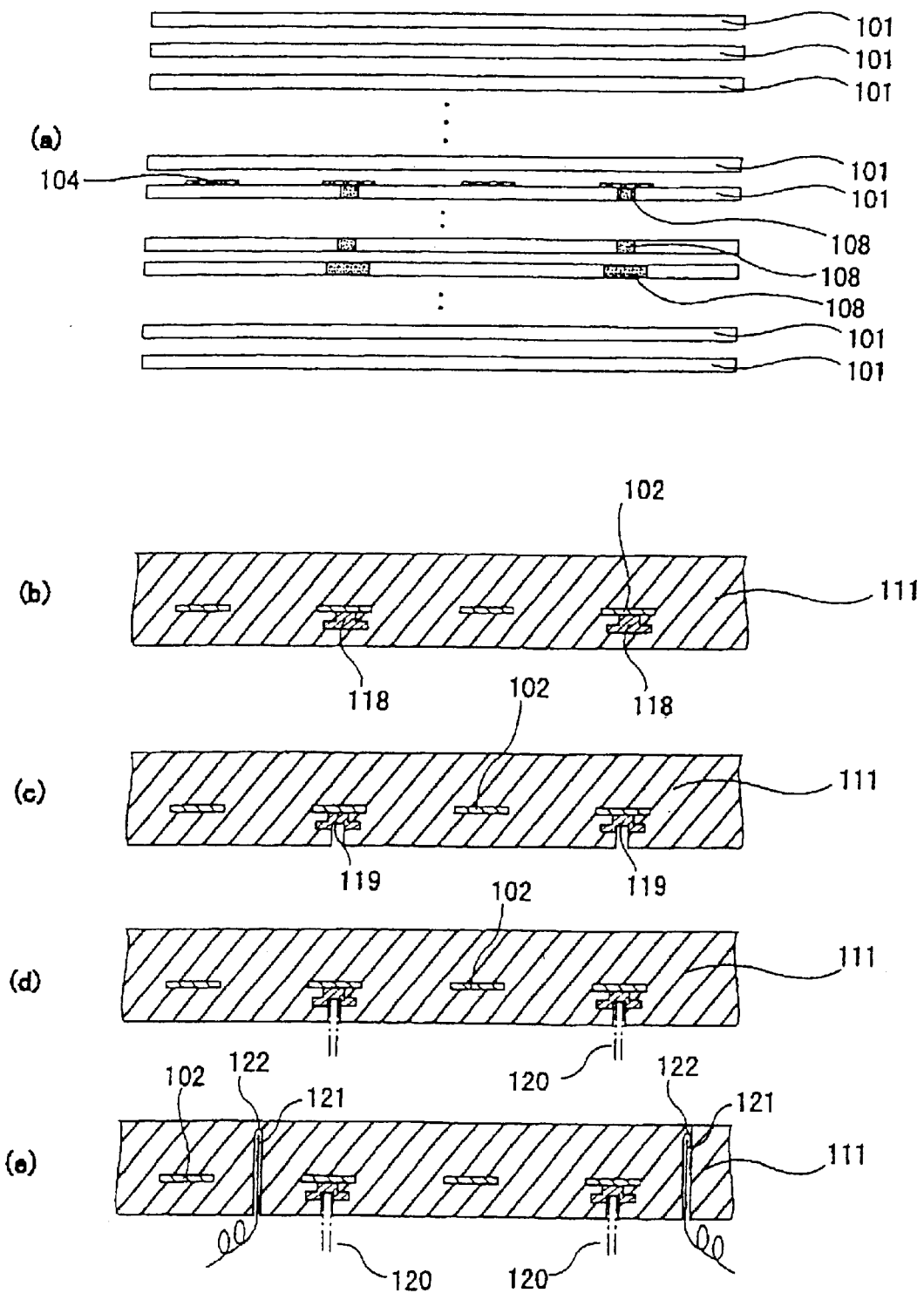
FIGS. 3(a) to (e) are schematic cross-section views illustrating the flow of manufacture of the ceramic board for semiconductor manufacture apparatuses in Example 1.

The green sheet processed above was laminated with 37 units of the green sheet not printed with the tungsten paste on the top side (heating side) and 13 units of the same unprinted green sheet on the bottom side at 130° C. under a pressure of 80 kg/cm$^2$ (FIG. 3(*a*)).

(4) The resulting laminate was degreased in a nitrogen gas atmosphere at 600° C. for 5 hours and hot-pressed at 1890° C. and 150 kg/cm$^2$ for 3 hours to give a 3 mm-thick aluminum nitride blank board. From this blank board, a 215 mm (dia.) disk was cut out to obtain a 0%-porosity ceramic disk internally provided with a 6 μm thick×10 mm wide conductor layer.

(5) The disk obtained above in (4) was ground on both sides simultaneously with a double-surface grinder using a #220 diamond wheel at 100 rpm while a pressure of 1 kg/cm$^2$ was applied. As a result, a ceramic board 111 internally provided with a 6 μm-thick×10 mm-wide conductor layer 102 was obtained (FIG. 3(*b*)).

(6) Then, the plated-through holes were partially bored to form recesses (FIG. 3(*c*)) and terminal pins 120 comprising Koval® were secured in the recesses with a Ni—Au brazing material heated to reflow at 700° C. (FIG. 3(*d*)). Then, blind holes 122 (diameter: 1.2 mm, depth: 2.0 mm) were drilled. In addition, a plurality of thermocouples 121 for temperature control were embedded in the blind holes 122 to complete the manufacture of a ceramic board equipped with a heating element functioning as a conductor layer (FIG. 3(*e*)).

The flatness of the wafer-mounting (heating) surface of this ceramic board was 15.5 μm in the X-direction and 12.4 μm in the Y-direction over a measurement range of 205 mm [diametric end-to-end length (215 mm)−10 mm=205 mm]. FIG. 3 is a diagrammatic representation of measurement results, where (a) represents the data in the X-direction and (b) represents the data in the Y-direction.

The above measurement of flatness was carried out using a warp tester (manufactured by Kyocera; Nanoway®). The measurements of flatness referred to below were also made with the same instrument.

Test Example 1

Manufacture of a Ceramic Board Internally Provided With a Conductor Layer

Except that diamond grinding was not performed, the procedure of Example 1 was otherwise repeated to provide a ceramic board.

The flatness of the wafer-mounting surface of this ceramic board was 25.5 μm in the X-direction and 23.4 μm in the Y-direction over the measurement length of 205 mm.

COMPARATIVE EXAMPLE 1

Manufacture of a Ceramic Board Internally Provided With a Conductor Layer

A ceramic substrate was fabricated in the same manner as in Example 1 and, then, subjected to the following diamond grinding.

Using a grinder having a #220 diamond wheel, only one side of the ceramic substrate was ground at 100 rpm under no-load (dead load).

The flatness of the wafer-mounting surface of the resulting ceramic board was 0.55 μm in the X-direction and 0.84 μm in the Y-direction over a measurement range of 205 mm.

Test Example 2

Except that the diameter of the substrate was set to 190 mm and the substrate was not ground, the procedure of Example 1 was otherwise repeated to provide a ceramic board.

The flatness of the wafer-mounting surface of this ceramic board was 25 μm in the X-direction and 23 μm in the Y-direction over a measurement range of 180 mm.

Comparative Example 2

Except that a ceramic disk to be rejected after hot-pressing was used, the procedure of Example 1 was otherwise repeated to provide a ceramic board.

The flatness of the wafer-mounting surface of this ceramic board was 55 μm in the X-direction and 52 μm in the Y-direction over a measurement range of 205 mm.

EXAMPLE 2

Manufacture of a Ceramic Board Provided With a Conductor Layer on the Surface (1) A composition prepared by compounding 100 weight parts of aluminum nitride powder (manufactured by Tokuyama Co.; average part. dia.: 1.1 µm), 4 weight parts of yttria (averate part. dia.: 0.4 µm) and 1 weight part of acrylic binder was placed in a mold and hot-pressed at 1890° C. and 150 kg/cm² for 3 hours to provide a sintered aluminum nitride blank board.

From this sintered aluminum nitride blank board, a 215 mm (dia.) disk was cut out and its surfaces were ground with a double-surface grinder using a #220 diamond wheel under a pressure of 1 kg/cm².

(2) The bottom surface of the sintered compact obtained above in (1) was printed with a conductor paste by screen printing. The printing pattern was a concentric circular pattern as shown in FIG. 1.

The conductor paste used was Solvest PS603D available from Tokuriki Kagaku Kenkyusho, which is used in the formation of plated-through holes in printed circuit boards.

This conductor paste is a silver-lead paste containing, based on 100 weight parts of silver, 7.5 weight parts of metal oxide comprising lead oxide (5 wt. %), zinc oxide (55 wt. %), silica (10 wt. %), boron oxide (25 wt. %) and alumina (5 wt. %). The silver powder had an average particle diameter of 4.5 Sum and constituted flaky particles.

(3) The above sintered compact printed with the conductor paste was heated at 780° C. to sinter the silver and lead in the conductor paste and bake them onto the sintered compact to form a heating element 12. This silver-lead heating element 12 was 5 µm thick×2.4 mm wide and had an area resistivity of 7.7 mΩ/□.

(4) The sintered compact prepared above in (3) was dipped in an electroless nickel plating bath comprising an aqueous solution containing nickel sulfate: 80 g/l, sodium hypophosphite: 24 g/l, sodium acetate: 12 g/l, boric acid: 8 g/l and ammonium chloride: 6 g/l to deposit a 1 µm-thick metal cover layer (nickel layer) on the surface of the silver-lead heating element 12.

(5) In the regions where terminals for connection to a power source are to be attached, a silver-lead soldering paste (manufactured by Tanaka Noble Metals) was applied by screen printing to form a solder layer.

Then, terminal pins 13 comprising Koval® were set on the solder layers and connected to the surface of the heating element 12 by heating for reflow at 420° C.

The flatness of the heating surface (wafer-mounting surface) of the ceramic board thus obtained was 20 µm in the X-direction and 18 µm in the Y-direction over a measurement length of 205 mm.

(6) Thermocouples for temperature control were set in the blind holes 14 and sealed with a polyimide resin cured at 190° C. for 2 hours to provide a ceramic heater 10 (FIG. 2).

This ceramic heater 10 is used in such a manner that, as shown in FIG. 2, a wafer 19 to be heated is supported with support pins 16 set in the through holes 15 of the ceramic substrate 11 at a distance of 50 µm from the ceramic substrate and heated to 250° C. The preferred clearance between the ceramic substrate and the wafer is 5 to 500 µm. When the clearance is too large or too small, the temperature distribution becomes uneven.

Comparative Example 3

Except that a ceramic disk rejected after hot-pressing was used and no diamond grinding was performed, the procedure of Example 2 was otherwise repeated to provide a ceramic board.

The flatness of the wafer-mounting surface of this ceramic board was 55 µm in the X-direction and 60 µm in the Y-direction over a measurement length of 205 mm.

Comparative Example 4

Except that only one side of the substrate was ground with a #220 diamond wheel at 100 rpm under no-load (dead load), the procedure of Example 2 was otherwise repeated to provide a ceramic board.

The flatness of the wafer-mounting surface of this ceramic board was 0.45 µm in the X-direction and 0.65 µm in the Y-direction over a measurement length of 205 mm.

Test Example 3

Except that no diamond grinding was performed, the procedure of Example 2 was otherwise repeated to provide a ceramic board.

The flatness of the wafer-mounting surface of this ceramic board was 23 µm in the X-direction and 22 µm in the Y-direction over a measurement length of 205 mm.

On each of the ceramic boards obtained in Examples 1 and 2, Test Examples 1 to 3 and Comparative Examples 1 to 4, a silicon wafer was mounted and the conductor layer (heating element) was supplied with a current to increase the heater temperature to 600° C. Then, the difference between the highest and lowest temperatures of the silicon wafer was measured with a thermoviewer. The difference values were 9° C. for Example 1, 25° C. for Test Example 1, and 9° C. for Test Example 2. In Comparative Example 1, the silicon wafer could not be neatly released and, when forced to release, the wafer was damaged. In the case of Comparative Example 2, the temperature rose only to 200° C.

In the case of Example 2, the temperature difference was 1° C. In the case of Comparative Example 3, the wafer could not be held apart by 50 µm, for the wafer would have contacted the ceramic board. In the case of Comparative Example 4, the silicon wafer could not be released from the ceramic board. In the case of Test Example 3, the temperature difference of the wafer was 5° C.

EXAMPLE 3

Manufacture of an Electrostatic Chuck (1) A paste prepared by compounding 100 weight parts of aluminum nitride powder (manufactured by Tokuyama Co.; average part. dia.: 1.1 µm), 4 weight parts of yttria (average part. dia.: 0.4 µm), 11.5 weight parts of acrylic binder, 0.5 weight part of dispersant and 53 weight parts of alcohol comprising 1-butanol and ethanol was molded by the doctor blade method to provide a 0.47 mm thick green sheet.

(2) This green sheet was dried at 80° C. for 5 hours.

(3) A conductor paste A was prepared by compounding 100 weight parts of a tungsten carbide powder with an average particle diameter of 1 µm, 3.0 weight parts of acrylic binder, 3.5 weight parts of the solvent α-terpineol and 0.3 weight part of dispersant.

A conductor paste B was similarly prepared by compounding 100 weight parts of a tungsten powder with an average particle diameter of 3 µm, 1.9 weight parts of acrylic binder, 3.7 weight parts of the solvent α-terpineol and 0.2 weight part of dispersant.

The conductive paste A was pattern-printed on the green sheet by screen printing to form an electrode pattern comprising comb-shaped static electrodes and a grid-shaped RF electrode.

The green sheet processed as above was laminated with 37 units of the green sheet not printed with the tungsten paste on the top side (heating side) and 13 units of the same unprinted green sheet on the bottom side at 130° C. and 80 kg/cm².

(4) The resulting laminate was degreased in a nitrogen gas atmosphere at 600° C. for 5 hours and hot-pressed at 1890° C. and 150 kg/cm² for 3 hours to prepare a 3 mm-thick aluminum nitride blank board. From this blank board, a 215 mm (dia.) disk was cut out and ground with a diamond wheel as in Example 1 to provide a ceramic board (electrostatic chuck) internally provided with a conductor layer 6 μm thick×10 mm wide.

Figure 4:
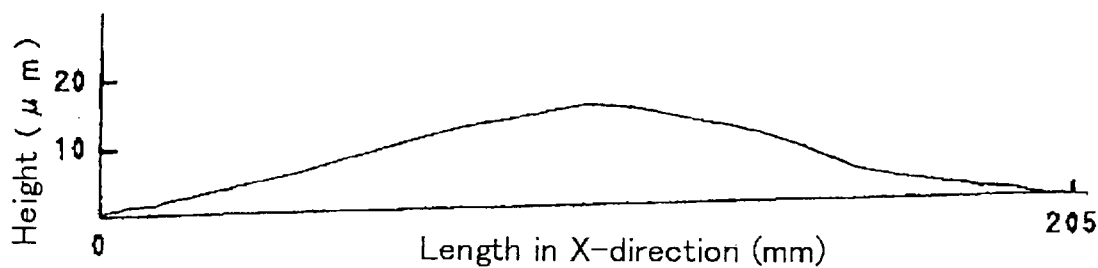
FIG. 4 is a diagrammatic representation of the surface flatness of the ceramic board for semiconductor manufacture apparatuses as fabricated in Example 1.
Figure 4:
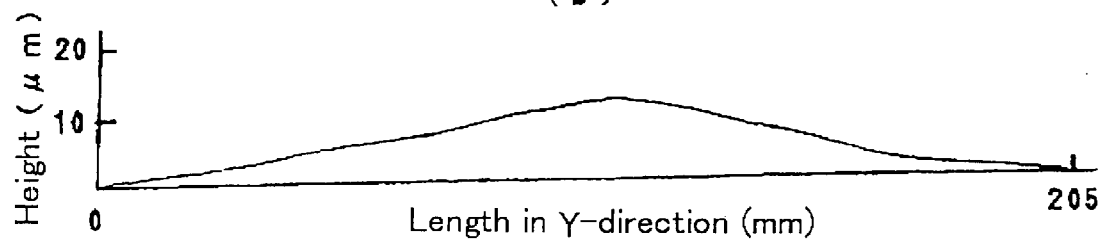
Figure 5:
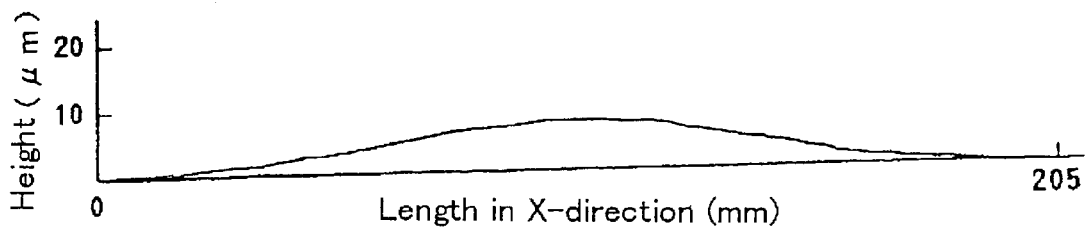
FIG. 5 is a diagrammatic representation of the surface flatness of the ceramic board for semiconductor manufacture apparatuses as fabricated in Example 2.
Figure 5:
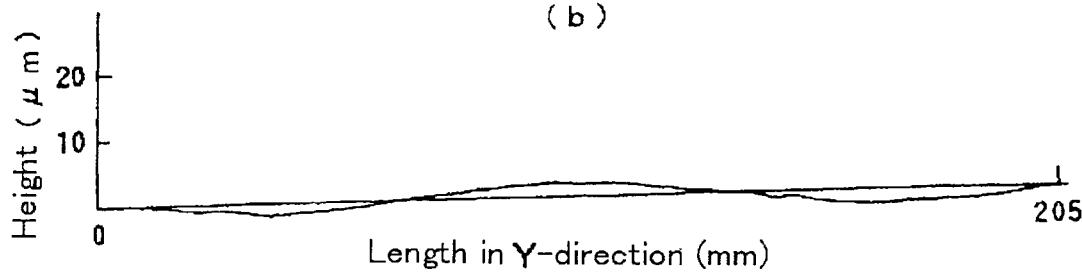

The flatness of the wafer-mounting (heating) surface of this ceramic board was 8.2 μm in the X-direction and 4.5 μm in the Y-direction over the measurement range of 205 mm. FIG. 4 is a diagrammatic representation of measurement results, where (a) represents data in the X-direction and (b) represents data in the Y-direction.

Test Example 4

Manufacture of an Electrostatic Chuck

Except that diamond grinding was not performed, the procedure of Example 3 was otherwise repeated to provide an electrostatic chuck.

The flatness of the wafer-mounting (heating) surface of this electrostatic chuck was 25.5 μm in the X-direction and 23.4 μm in the Y-direction over a measurement range of 205 mm.

Comparative Example 5

Manufacture of an Electrostatic Chuck

An aluminum nitride board was prepared as in Example 3 and ground with a diamond wheel as in Comparative Example 1 to provide an electrostatic chuck.

The flatness of the wafer-mounting surface of this electrostatic chuck was 0.55 μm in the X-direction and 0.84 μm in the Y-direction over a measurement range of 205 mm.

Test Example 5

Except that the diameter of the ceramic disk was set to 190 mm and the disk was not ground, the procedure of Example 3 was otherwise repeated to provide an electrostatic chuck.

The flatness of the wafer-mounting (heating) surface of this electrostatic chuck was 26 μm in the X-direction and 25 μm in the Y-direction over a measurement range of 180 mm.

Comparative Example 6

Except that a ceramic board rejected after hot-pressing was used, the procedure of Example 3 was otherwise repeated to provide an electrostatic chuck.

The flatness of the wafer-mounting (heating) surface of this electrostatic chuck was 55 μm in the X-direction and 52 μm in the Y-direction over a measurement range of 205 mm.

Then, to evaluate the chucking forces of the electrostatic chucks manufactured as above, a voltage of 1 kV was applied to each chuck to attract a silicon wafer and the force required to release the wafer was measured by means of a load cell. As a result, the releasing force required in a vacuum was 125 g/cm² in the case of the electrostatic chuck according to Example 3 and 80 g/cm² in the case of the electrostatic chuck according to Test Example 4. With the electrostatic chuck according to Comparative Example 5, the silicon wafer became unreleasable when the atmospheric pressure was reinstated and, when forced to release it, the wafer was damaged. In the case of the electrostatic chuck according to Test Example 5, the releasing force required was 110 kg/cm². As to the electrostatic chuck according to Comparative Example 6, the wafer cracked when a voltage of 1 kV was applied to the chuck to measure the force of attraction.

EXAMPLE 4

Manufacture of a Wafer Prover (1) A composition prepared by compounding 100 weight parts of aluminum nitride powder (manufactured by Tokuyama Co.; average part. dia.: 1.1 μm), 4 weight parts of yttria (average part. dia.: 0.4 μm), 11.5 weight parts of acrylic binder, 0.5 weight part of dispersant and 53 weight parts of alcohol comprising 1-butanol and ethanol was molded by the doctor blade method to provide a 0.47 mm-thick green sheet.

(2) This green sheet was dried at 80° C. for 5 hours and punched to pierce through holes for use as plated-through holes for connecting a heating element to external terminal pins.

(3) A conductive paste A was prepared by compounding 100 weight parts of a tungsten carbide powder with an average particle diameter of 1 μm, 3.0 weight parts of acrylic binder, 3.5 weight parts of the solvent a-terpineol, and 0.3 weight part of dispersant.

Similarly, a conductive paste B was prepared by compounding 100 weight parts of a tungsten powder with an average particle diameter of 3 μm, 1.9 weight parts of acrylic binder, 3.7 weight parts of the solvent α-terpineol, and 0.2 weight part of dispersant.

Then, using the conductive paste A, a grid-shaped guard electrode pattern 50 and a ground electrode pattern 60 were printed on the green sheet by screen printing.

In addition, the through holes for the plated-through holes for connecting terminal pins were filled with the conductive paste B.

Then, this printed green sheet 30 was laminated with 50 units of the unprinted green sheet 30 at 130° C. and 80 kg/cm² to provide a laminate (FIG. 6(a)).

(4) This laminate was degreased in a nitrogen gas atmosphere at 600° C. for 5 hours and hot-pressed at 1890° C. and 150 kg/cm² for 3 hours to provide a 3 mm-thick aluminum nitride blank board. From this blank board, a 215 mm (dia.) disk was cut out (FIG. 6(b)). The size of plated-through holes 26, 27 was 0.2 mm in diameter and 0.2 mm deep.

The thickness of said guard electrode 5 and ground electrode 6 was 10 μm. The position of the guard electrode 5 was 1 mm from the wafer-mounting surface and the position of the ground electrode 6 was 1.2 mm from the wafer-mounting surface.

(5) The disk obtained above in (4) was ground with a diamond wheel as in Example 1 and, with a mask set in position, cavities for accepting thermocouples (not shown) and grooves 7 (0.5 mm wide×0.5 mm deep) for attracting a silicon wafer were formed by SiC blasting (FIG. 6(c)).

(6) Then, a heating element 41 was printed on the surface opposite to the wafer-mounting surface. This printing was made with a conductor paste. The conductor paste used was Solbest PS603D manufactured by Tokuriki Kagaku Kenkyusho, which is used in the formation of plated-through holes in printed circuit boards. This conductor paste contained, based on 100 weight parts of silver, 7.5 weight parts of metal oxide composed of lead oxide, zinc oxide, silica, boron oxide and alumina (5/55/10/25/5, by weight).

The silver powder used had an average particle diameter of 4.5 μm and constituted flaky particles.

Figure 6:
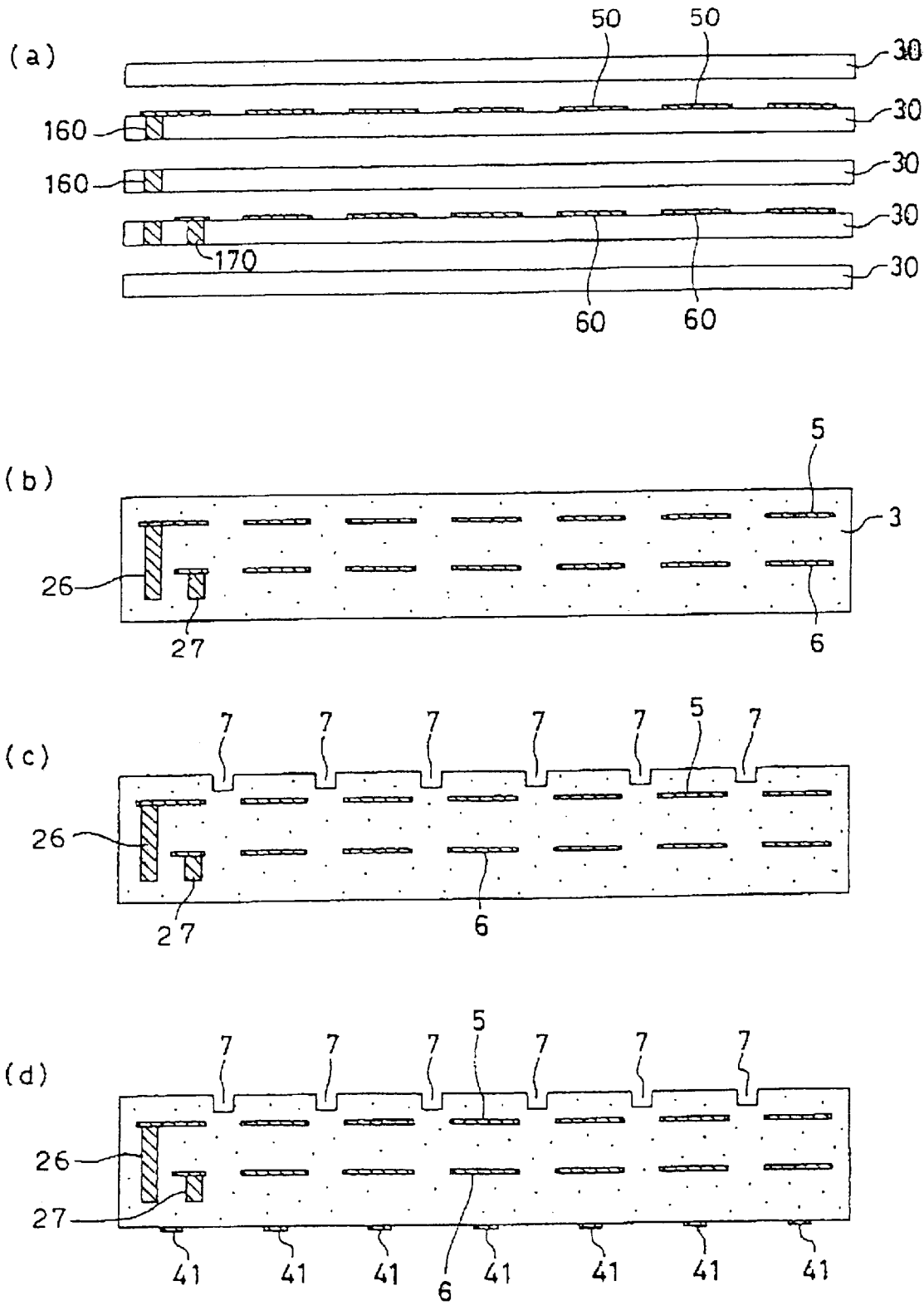
FIGS. 6(a) to (d) are schematic cross-section views illustrating the flow of manufacture of the ceramic board for semiconductor manufacture apparatuses in Example 3.

(7) The heater plate printed with the conductive paste as above was heated at 780° C. to sinter the silver and lead in the paste and bake them onto the ceramic substrate 3 to form a heating element 41 (FIG. 6(*d*)). This heater plate was then dipped in an electroless plating bath comprising an aqueous solution containing nickel sulfate: 30 g/l, boric acid: 30 g/l, ammonium chloride: 30 g/l and Rochelle salt: 60 g/l to deposit a 1 μm-thick nickel layer 410 (boron content ≦ 1 wt. %) on the surface of the sintered silver heating element 41. Thereafter, the heater plate was annealed at 120° C. for 3 hours.

The heating element of sintered silver was 5 μm thick ×2.4 mm wide and had an area resistivity of 7.7 mΩ/□.

(8) On the surface formed with grooves 7, a titanium layer, a molybdenum layer and a nickel layer were serially constructed by sputtering. As the sputtering equipment, SV-4540 manufactured by Japan Vacuum Technology Co. was used. The sputtering conditions were 0.6 Pa, 100° C. and 200 W and the sputtering time was adjusted according to the kind of metal within the range of 30 seconds to 1 minute.

The thickness of each metal film according to the image output of a fluorescent X-ray analyzer was the titanium layer: 0.3 μm, the molybdenum layer: 2 μm, and the nickel layer: 1 μm.

(9) Using an electroless nickel plating bath comprising an aqueous solution of nickel sulfate: 30 g/l, boric acid: 30 g/l, ammonium chloride: 30 g/l and Rochelle salt: 60 g/l and an electrolytic nickel plating bath containing nickel sulfate: 250 to 350 g/l, nickel chloride: 40 to 70 g/l, and boric acid: 30 to 50 g/l and adjusted to pH 2.4 to 4.5 with sulfuric acid, the ceramic substrate obtained in (8) was dipped to deposit a 7 μm-thick nickel layer (boron content ≦ 1 wt. %) on the surface of the above metal layer formed by sputtering and the substrate was then annealed at 120° C. for 3 hours.

The surface of the heating element, which was not electrically conductive, was not plated by the electrolytic nickel plating.

Figure 7:
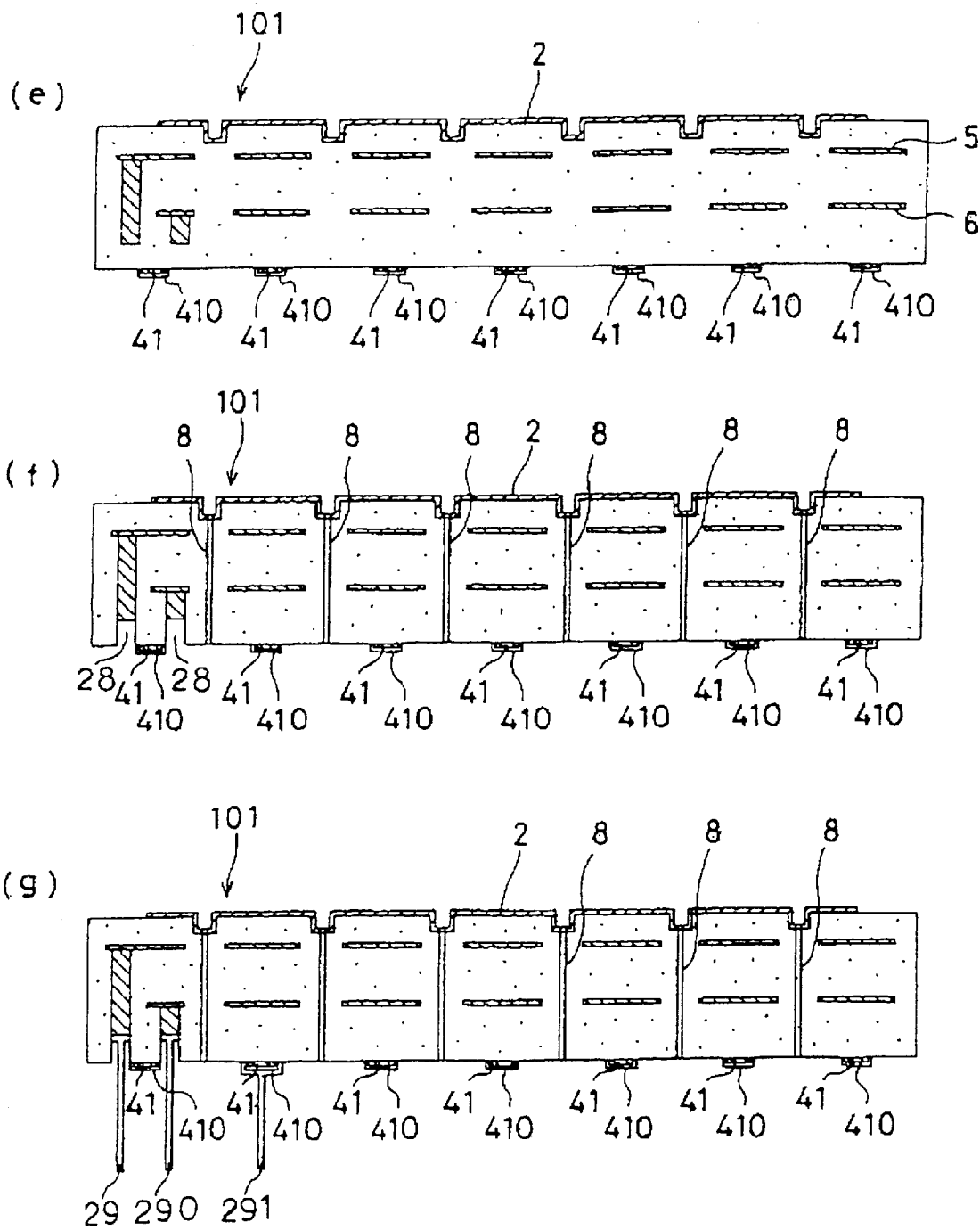
FIGS. 7(e) to (g) are schematic cross-section views illustrating the flow of manufacture of the ceramic board for semiconductor manufacture apparatuses in Example 3.

Then, the board was dipped in an electroless gold plating bath containing potassium gold cyanide: 2 g/l, ammonium chloride: 75 g/l, sodium citrate: 50 g/l and sodium hypophosphite: 10 g/l at 93° C. for 1 minute to form a 1 μm-thick gold layer on the nickel plate (FIG. 7(*e*)).

(10) Air suction holes 8 extending from the grooves 7 to the reverse side were formed by drilling, and recesses 28 for exposing the plated-through holes 26, 27 were formed (FIG. 7 (*f*)). In the recesses 28, external terminal pins 29, 290 comprising Koval® were secured with a Ni-Au brazing alloy (Au: 81.5 wt. %, Ni: 18.4 wt. %,impurity: 0.1 wt. %) heated for reflow at 970° C. (FIG. 7(*g*)). Moreover, external terminal pins 291 comprising Koval® were connected to the heating element with the aid of a solder (tin/lead=9/1).

(11) Then, a plurality of thermocouples for temperature control were embedded in the cavities to obtain a wafer prover. The flatness of the wafer-mounting surface of this wafer prover was 15.5 μm in the X-direction and 12.4 μm in the Y-direction over a measurement range of 205 mm.

Figure 8:
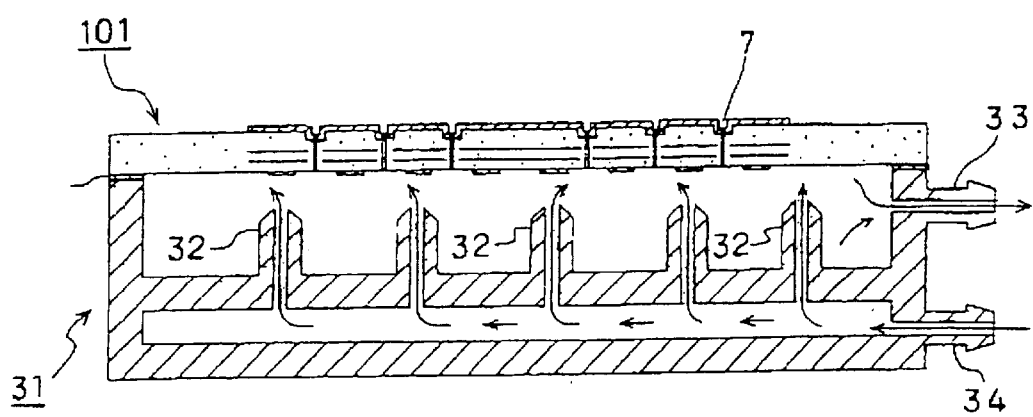
FIG. 8 is a schematic section view showing the ceramic board obtained in Example 3 as mounted on a support base.

(12) This wafer prover 101 was set on a stainless steel support 31 through a ceramic fiber (manufactured by Ibiden; trade name: Ibi-Wool) insulation 30 as shown in FIG. 8. This support 31 is provided with a plurality of nozzle ports 32 for ejecting a cooling medium to thereby adjust the temperature of the wafer prover 101. It is also provided with a suction port 33 for aspirating the cooling medium or air to thereby attract the silicon wafer.

Test Example 6

Manufacture of a Wafer Prover

Except that diamond grinding was not performed, the procedure of Example 4 was otherwise repeated to provide a wafer prover.

The flatness of the wafer-mounting surface of this wafer prover was 25.5 μm in the X-direction and 23.4 μm in the Y-direction over a measurement range of 205 mm.

Comparative Example 7

Except that a ceramic substrate rejected after hot-pressing was used, the procedure of Example 4 was otherwise repeated to provide a wafer prover.

The flatness of the wafer-mounting surface of this wafer prover was 55 μm in the X-direction and 52 μm in the Y-direction over a measurement range of 205 mm.

A silicon wafer was mounted on each of the wafer provers obtained in Example 4 and Test Example 6 and heated. With the wafer prover according to Example 4, the silicon wafer was not damaged. With the wafer prover according to Test Example 6, the wafer was destroyed.

A silicon wafer was mounted on the wafer prover obtained in Comparative Example 7 and the temperature was increased to 200° C. However, because the wafer and the prover were in line contact, the wafer temperature failed to rise and the test could not be performed.

Thus, in accordance with the present invention, wherein the flatness of the wafer-mounting surface is controlled to not more than 50 μm, a silicon wafer can be successfully heated. In particular, a uniform wafer temperature can be obtained by controlling the flatness to not more than 20 μm. Moreover, chucking the work causes no wafer damage.

The above results are particularly remarkable with disk-shaped ceramic boards not less than 200 mm in diameter.

INDUSTRIAL APPLICABILITY

As described above, the ceramic board for semiconductor manufacture apparatuses according to the present invention, when used as a heater, heats a silicon wafer uniformly throughout and, hence, does not damage the wafer and, when used as an electrostatic chuck, provides a sufficient chucking force, thus finding application as implements for semiconductor manufacture apparatuses, such as the hot plate, electrostatic chuck and wafer prover, with the outstanding advantage.

What is claimed is:

1. A ceramic heater for a semiconductor manufacturing apparatus comprising a ceramic substrate in the form of a disk and a heating element disposed on the surface of said ceramic substrate or internally in said ceramic substrate, wherein the ceramic substrate has a semiconductor wafer mounting surface for directly mounting a semiconductor wafer thereon, and the semiconductor wafer mounting surface is controlled to a flatness of 1 to 50 μm over a measurement area which ranges until a point 10 mm distant from the diametric end of the semiconductor wafer mounting surface.

2. The ceramic heater according to claim 1, wherein the semiconductor wafer mounting surface is controlled to a flatness of 1 to 20 μm.

3. The ceramic heater according to claim 1, wherein the semiconductor wafer mounting surface is controlled to a flatness of 1 to 18 μm.

4. The ceramic heater according to claim 1, wherein said ceramic substrate has a diameter of in excess of 150 mm.

5. The ceramic heater according to claim 1, wherein said ceramic substrate comprises a nitride ceramic.

6. The ceramic heater according to claim 1, wherein said ceramic substrate comprises aluminum nitride.

7. The ceramic heater according to claim 1, wherein said ceramic substrate comprises more than 50 weight % of aluminum nitride.

8. The ceramic heater according to claim 1, wherein said ceramic substrate contains sintering aids.

9. The ceramic heater according to claim 1, wherein said ceramic substrate contains alkali metals, alkaline earth metals, or rare earth metals.

10. The ceramic heater according to claim 1, wherein said ceramic substrate contains Na, Li, Ca, Rb, or Y.

11. An electrostatic chuck comprising the ceramic heater according to claim 1, wherein said ceramic substrate comprises an electrostatic electrode.

12. A wafer prover comprising the ceramic heater according to claim 1, wherein the ceramic substrate has a chuck top electrode formed on the surface thereof.

13. The ceramic heater according to claim 1, wherein said heating element is disposed internally in said ceramic substrate, and is formed as at least one layer in the center in the thickness direction thereof, or in an offset position displaced from said center in the thickness direction toward the surface thereof, said surface being opposite to the semiconductor wafer mounting surface.

14. The ceramic heater according to claim 1, wherein the configuration of said heating element is a plane, several divisions of a plane, a vortex, concentric circles, or a grid.

15. The ceramic heater according to claim 1, wherein said heating element, is formed on the surface opposite to the semiconductor wafer mounting surface.

16. The ceramic heater according to claim 1, heated to a temperature of not less than 200° C.

17. A ceramic heater for a semiconductor manufacturing apparatus comprising a ceramic substrate in the form of a disk and a heating element disposed on the surface of or inside the ceramic substrate, wherein the ceramic substrate has a semiconductor wafer supporting surface for indirectly supporting a semiconductor wafer at a fixed distance from the surface of the ceramic substrate, and the semiconductor wafer supporting surface is controlled to a flatness of 1 to 50 $\mu$m over a measurement area which ranges until a point 10 mm distance from diametric end of the semiconductor wafer supporting surface.

18. The ceramic heater according to claim 17, wherein the semiconductor wafer supporting surface is controlled to a flatness of 1 to 20 $\mu$m.

19. The ceramic heater according to claim 17, wherein the semiconductor wafer supporting surface is controlled to a flatness of 1 to 18 $\mu$m.

20. The ceramic heater according to claim 17, wherein said ceramic substrate has a diameter of in excess of 150 mm.

21. The ceramic heater according to claim 17, wherein said ceramic substrate comprises a nitride ceramic.

22. The ceramic heater according to claim 17, wherein said ceramic substrate comprises aluminum nitride.

23. The ceramic heater according to claim 17, wherein said ceramic substrate comprises more than 50 weight % of aluminum nitride.

24. The ceramic heater according to claim 17, wherein said ceramic substrate contains sintering aids.

25. The ceramic heater according to claim 17, wherein said ceramic substrate contains alkali metals, alkaline earth metals, or rare earth metals.

26. The ceramic heater according to claim 17, wherein said ceramic substrate contains Na, Li, Ca, Rb, or Y.

27. An electrostatic chuck comprising the ceramic heater according to claim 17, wherein said ceramic substrate comprises an electrostatic electrode.

28. A wafer prover comprising the ceramic heater according to claim 17, wherein the ceramic substrate has a chuck top electrode formed on the surface thereof.

29. The ceramic heater according to claim 17, wherein said heating element is disposed internally in said ceramic substrate, and is formed as at least one layer in the center in the thickness direction thereof, or in an off set position displaced from said center in the thickness direction toward the surface thereof, said surface being opposite to the semiconductor wafer supporting surface.

30. The ceramic heater according to claim 17, wherein the configuration of said heating element is a plane, several divisions of a plane, a vortex, concentric circles, or a grid.

31. The ceramic heater according to claim 17, wherein said heating element is formed on the surface opposite to the semiconductor wafer supporting surface.

32. The ceramic heater according to claim 17, wherein said ceramic substrate has a supporting pin for a silicon wafer.

33. The ceramic heater according to claim 17, having a semiconductor wafer which is heated and supported at a clearance of 50 to 500 $\mu$m between said semiconductor wafer and said ceramic substrate.

34. The ceramic heater according to claim 17, which is heated to a temperature of not less than 200° C.

* * * * *